(12) United States Patent
Kumagai et al.

(10) Patent No.: US 7,563,155 B2
(45) Date of Patent: Jul. 21, 2009

(54) CUTTING APPARATUS WITH ULTRASONIC TRANSDUCER

(75) Inventors: Souu Kumagai, Ota-Ku (JP); Fumiteru Tashino, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/123,322

(22) Filed: May 19, 2008

(65) Prior Publication Data

US 2008/0306432 A1    Dec. 11, 2008

(30) Foreign Application Priority Data

Jun. 5, 2007    (JP) ............................. 2007-149487

(51) Int. Cl.
*B24B 9/00* (2006.01)
(52) U.S. Cl. ...................... 451/165; 125/13.01; 83/666; 83/676; 83/701; 83/956
(58) Field of Classification Search ................. 451/165; 123/13.01; 83/666, 676, 701, 956
See application file for complete search history.

(56) References Cited

U.S. PATENT DOCUMENTS

| | | | | |
|---|---|---|---|---|
| 2,911,773 A | * | 11/1959 | Gobat | 451/41 |
| 3,471,724 A | * | 10/1969 | Balamuth | 310/26 |
| 6,058,823 A | * | 5/2000 | Michoud | 83/508.3 |
| 6,098,514 A | * | 8/2000 | Sato et al. | 83/425.3 |
| 6,250,188 B1 | * | 6/2001 | Sato et al. | 83/35 |
| 6,497,164 B1 | * | 12/2002 | Sato | 76/115 |
| 2006/0032332 A1 | * | 2/2006 | Ohnishi | 76/25.1 |

FOREIGN PATENT DOCUMENTS

JP    A 2004-291636    10/2004

* cited by examiner

*Primary Examiner*—Maurina Rachuba
(74) *Attorney, Agent, or Firm*—Greer, Burns & Crain, Ltd.

(57) ABSTRACT

A cutting apparatus includes a blade mount supporting a first ultrasonic transducer for imparting ultrasonic vibrations to a cutting blade. The blade mount includes an annular flange having a grip surface on an outer circumferential side surface thereof for gripping the cutting blade, a first ultrasonic transducer housing portion for housing the first ultrasonic transducer, and a hollow cylindrical mount boss having a fitting hole fitting over the spindle. The annular flange has a plurality of through holes defined therein between the first ultrasonic transducer housing portion and the mount boss. A blade grip flange has a fitting hole fitted over the mount boss, a grip surface on an outer circumferential side surface thereof for gripping the cutting blade, a second ultrasonic transducer housing portion for housing a second ultrasonic transducer, and a plurality of through holes defined therein between the second ultrasonic transducer housing portion and the fitting hole.

2 Claims, 4 Drawing Sheets

CUTTING APPARATUS WITH ULTRASONIC TRANSDUCER

BACKGROUND OF THE INVENTION

1. Field of the Invention

The present invention relates to a cutting apparatus for cutting a workpiece such as a semiconductor wafer, an optical device wafer, or the like.

2. Description of the Related Art

According to the present semiconductor device fabrication process, a plurality of areas are defined on the surface of a substantially disk-shaped semiconductor wafer by a grid-like pattern of division lines called streets, and devices of ICs, LSI circuits, or the like are formed in the defined areas. Then, the semiconductor wafer is cut along the streets to divide the areas into individual semiconductor chips. An optical device wafer including a layer of gallium nitride compound semiconductor or the like stacked on the surface of a sapphire substrate is also cut along streets into individual optical devices such as light-emitting diodes, laser diodes and CCDs for use in a wide range of electric appliances.

The wafer is cut along the streets by a cutting apparatus referred to as a dicer. The cutting apparatus includes a chuck table for supporting a workpiece such as a wafer, cutting means for cutting the workpiece held by the chuck table, and feeding means for feeding the chuck table and the cutting means relatively to each other. The cutting means includes a spindle unit having a rotating spindle, a cutting blade mounted on the rotating spindle, and a drive mechanism for rotating the rotating spindle. The cutting apparatus operates to feed the cutting blade and the workpiece held by the chuck table relatively to each other while the cutting blade is being rotated at a rotational speed ranging from 20,000 to 40,000 rpm.

The wafer with the devices formed thereon is made of hard brittle materials including silicon, sapphire, silicon nitride, glass and lithium tantalate. When the wafer is cut by the cutting blade, the cut surfaces may be chipped, lowering the quality of certain devices. Wafer materials such as sapphire with high Morse hardnesses are highly difficult, if not impossible, to cut with the cutting blade.

In order to solve the above problems, there has been proposed a cutting apparatus for applying an AC voltage to an ultrasonic transducer fixed to the surface of a cutting blade to ultrasonically vibrate the cutting blade while the cutting blade is cutting a workpiece (see, for example, Japanese Patent Laid-Open No. 2004-291636). However, the proposed cutting apparatus is disadvantageous in that it is difficult to transmit the ultrasonic vibrations generated by the ultrasonic transducer in a sufficient amplitude range.

SUMMARY OF THE INVENTION

It is therefore an object of the present invention to provide a cutting apparatus which is capable of transmitting the ultrasonic vibrations generated by an ultrasonic transducer in a sufficient amplitude range.

In accordance with an aspect of the present invention, there is provided a cutting apparatus comprising: a chuck table for holding a workpiece; and cutting means having a cutting blade for cutting the workpiece held by said chuck table, said cutting means including a spindle rotatably supported by a spindle housing, a blade mount mounted on an end portion of said spindle and having a first ultrasonic transducer for imparting ultrasonic vibrations to said cutting blade, and a blade grip flange disposed on said blade mount for gripping said cutting blade in coaction with said blade mount and having a second ultrasonic transducer for imparting ultrasonic vibrations to said cutting blade; said blade mount including: an annular flange having a grip surface on an outer circumferential side surface for gripping said cutting blade and a first ultrasonic transducer housing portion for housing said first ultrasonic transducer; and a hollow cylindrical mount boss laterally projecting centrally from said annular flange and having a fitting hole fitting over said spindle; said annular flange having a plurality of through holes defined between said first ultrasonic transducer housing portion and said mount boss; said blade grip flange having a fitting hole defined centrally and fitted over said mount boss, a grip surface on an outer circumferential side surface for gripping said cutting blade, a second ultrasonic transducer housing portion for housing said second ultrasonic transducer, and a plurality of through holes defined between said second ultrasonic transducer housing portion and said fitting hole.

The cutting apparatus preferably further includes contact members mounted respectively on the grip surface of the blade mount and the grip surface of the blade grip flange.

As the annular flange of the blade mount has the through holes defined therein and the blade grip flange has the through holes defined therein, the blade mount and the blade grip flange have their rigidity reduced by these through holes, and transmit ultrasonic vibrations generated by the first and second ultrasonic transducers with an increased amplitude. Accordingly, the cutting blade gripped by the blade mount and the blade grip flange is caused to vibrate ultrasonically with a large radial amplitude.

The above and other objects, features, and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A cutting apparatus according to a preferred embodiment of the present invention will be described in detail below with reference to the accompanying drawings.

Figure 1:
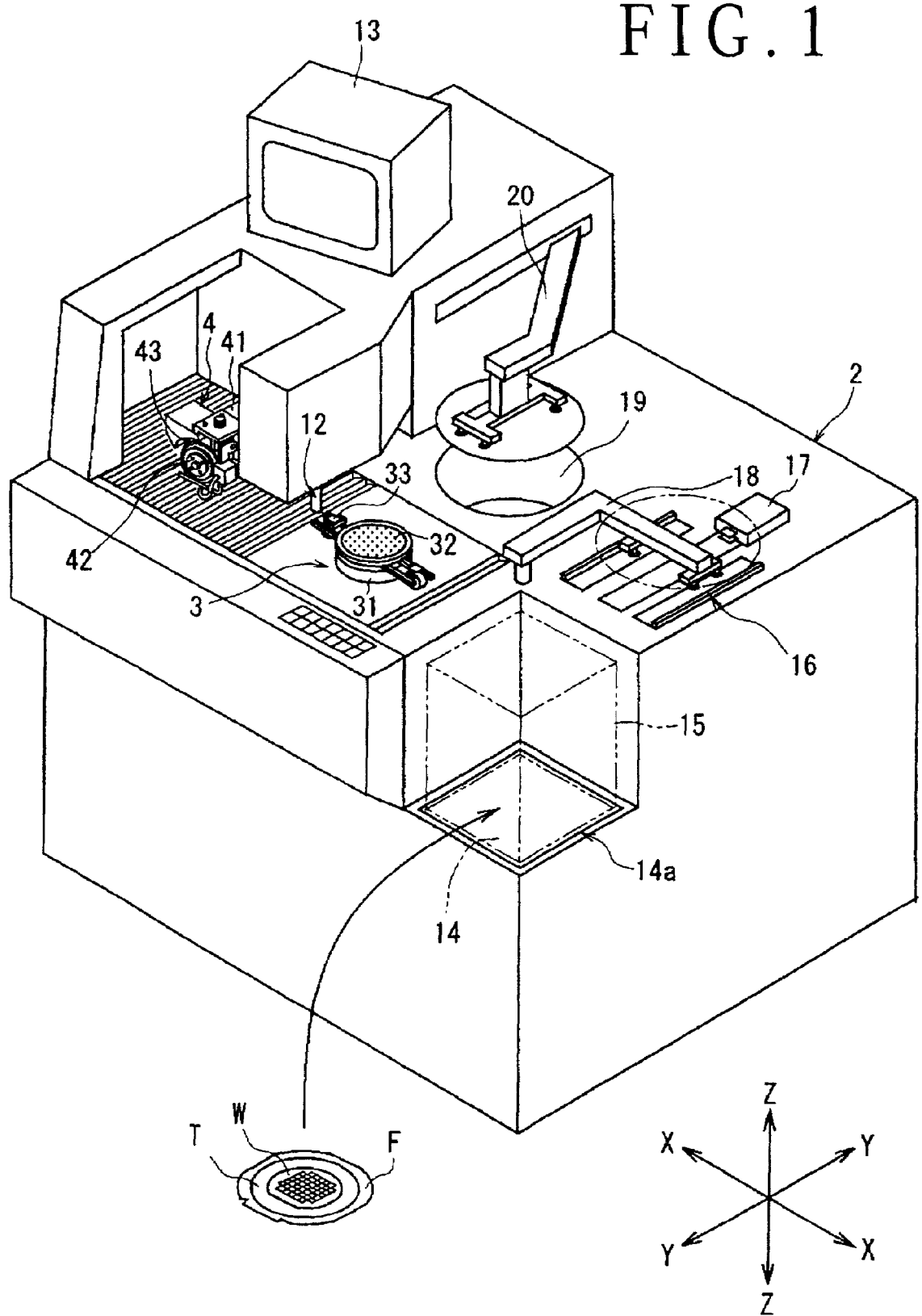
FIG. 1 is a perspective view of a cutting apparatus according to the present invention.

FIG. 1 shows in perspective a cutting apparatus according to the present invention. As shown in FIG. 1, the cutting apparatus has an apparatus housing 2 in the shape of a rectangular parallelepiped. The apparatus housing 2 accommodates therein a chuck table 3 for holding a workpiece such as a wafer, which is movable in a feeding direction indicated by the arrow X. The chuck table 3 has a suction chuck support base 31 and a suction chuck 32 mounted on the suction chuck support base 31. The workpiece is attracted to and held by an upper holding surface of the suction chuck 32 by suction means, not shown, coupled to the chuck table 3. The chuck table 3 is rotatable about its own axis by a rotating mechanism, not shown. The chuck table 3 is combined with a clamp 33 for clamping a support frame which supports the workpiece through a protective tape. The chuck table 3 is movable by feed means, not shown, in the feeding direction indicated by the arrow X.

The cutting apparatus includes a spindle unit 4 as cutting means. The spindle unit 4 includes a spindle housing 41 mounted on a movable base, not shown, for positional adjustment in an indexing direction indicated by the arrow Y and a cutting-in direction indicated by the arrow Z, a rotary spindle 42 rotatably supported on the spindle housing 41, and a cutting blade 43 mounted on the distal end of the rotary spindle 42.

The cutting blade 43 and its mounting structure will be described below with reference to FIGS. 2 through 5. The cutting blade 43 includes an annular grinding stone blade made of abrasive grains of diamond or the like which are bonded together by a binder. The cutting blade 43 may be a resinoid blade produced by mixing abrasive grains with a resin bonding material, molding the mixture into an annular blank, and baking the annular blank, a metal blade produced by mixing abrasive grains with a metal bonding material, molding the mixture into an annular blank, and baking the annular blank, or an electrocast blade produced by joining abrasive grains to the side surfaces of a base of aluminum or the like by a plated layer of a metal such as nickel. The annular cutting blade 43 has a fitting hole 431 dimensioned to fit over a mount boss 52 of a blade mount 5 to be described below.

Figure 2:
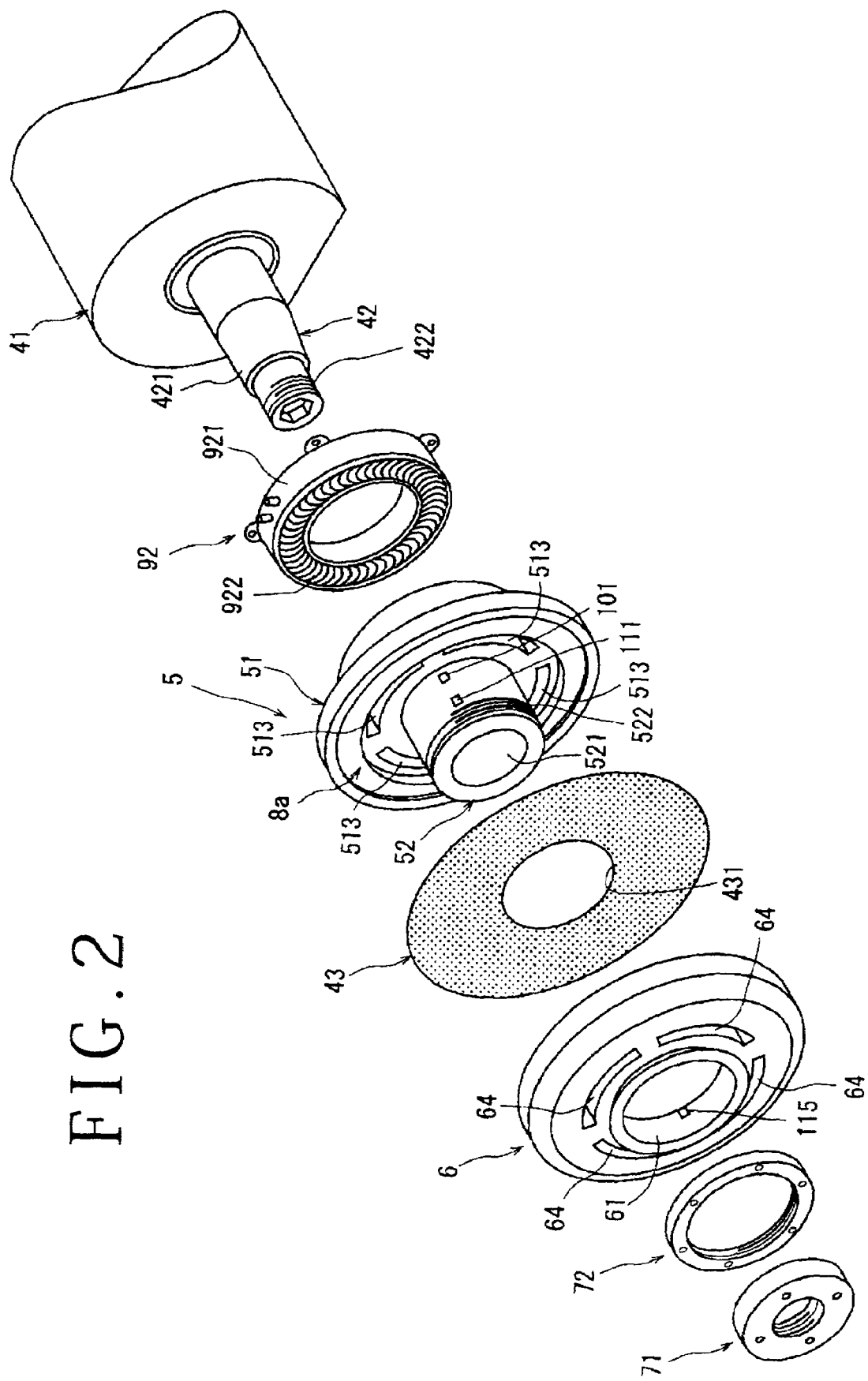
FIG. 2 is an exploded perspective view of a spindle unit installed on the cutting apparatus shown in FIG. 1.
Figure 3:
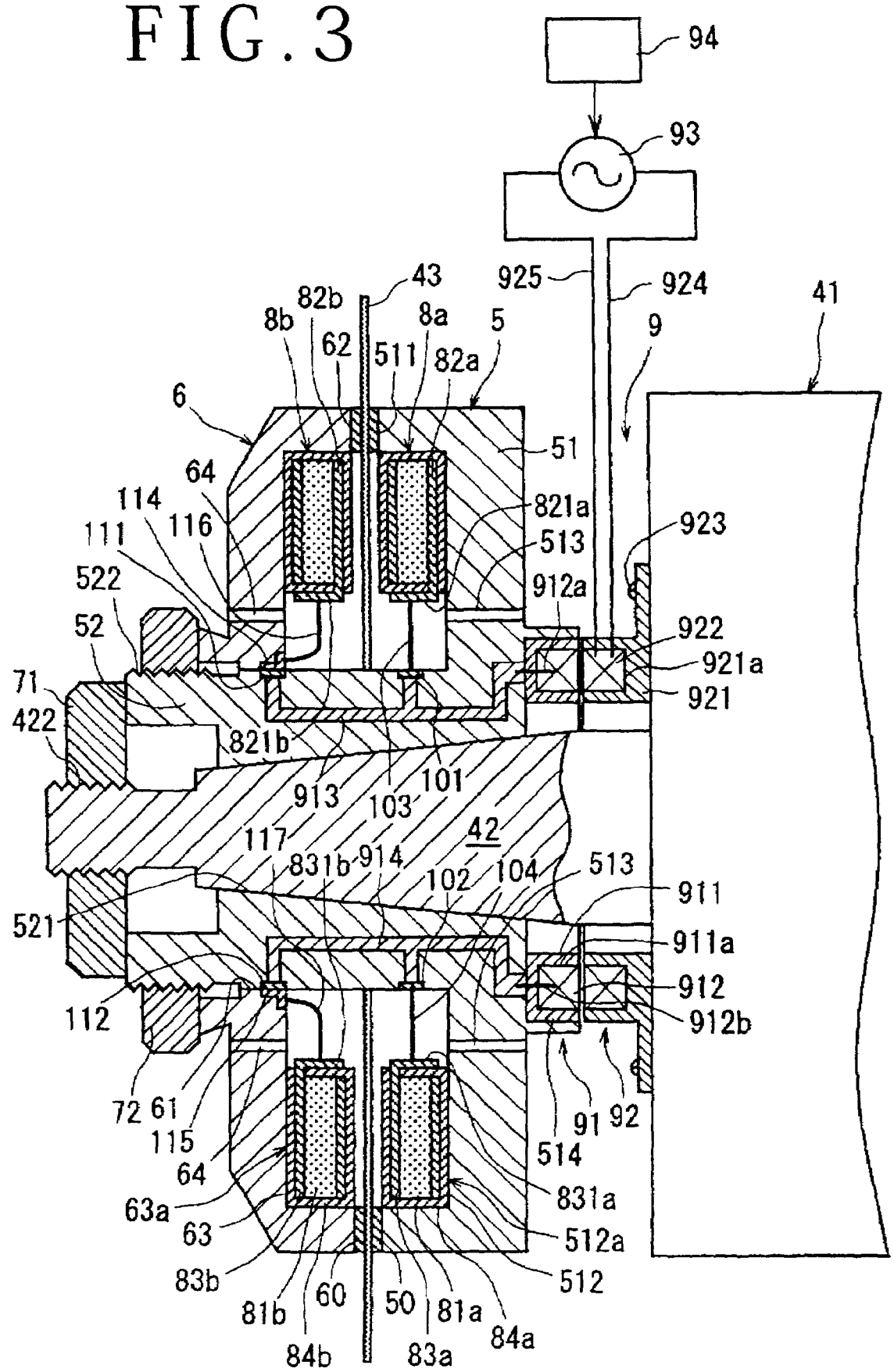
FIG. 3 is an enlarged cross-sectional view of the spindle unit installed on the cutting apparatus shown in FIG. 1.

As shown in FIG. 3, the cutting blade 43 constituted above is fixedly sandwiched between the blade mount 5 which is mounted on the rotary spindle 42 rotatably supported on the spindle housing 41 of the cutting apparatus and a blade grip flange 6 disposed in facing relation to the blade mount 5. As shown in FIGS. 2 and 3, the blade mount 5 includes an annular flange 51 and the mount boss 52, which is of a hollow cylindrical shape, projecting laterally from a central region of the annular flange 51. The annular flange 51 has, on its side facing the mount boss 52, an annular grip surface 511 along an outer circumferential edge thereof for gripping the cutting blade 43, and an annular recess 512 defined therein radially inwardly of the grip surface 511 and having an ultrasonic transducer housing portion 512a for housing a first ultrasonic transducer 8a to be described later. A contact member 50 made of synthetic resin or the like is mounted on the grip surface 511. The contact member 50 should preferably have a Shore hardness D40 or higher.

The annular flange 51 has a plurality of axially through holes 513 defined therein between the ultrasonic transducer housing portion 512a and the mount boss 52. In the illustrated embodiment, as shown in FIG. 2, the axially through holes 513 include four arcuate holes. The mount boss 52 has an axially through fitting hole 521 defined therein, and also has a distal end portion with male threads 522 on its outer circumferential surface. The fitting hole 521 has a tapered inner circumferential surface complementary in shape to a tapered outer circumferential surface 421 of a distal end portion of the rotary spindle 42.

The blade grip flange 6 is of an annular shape having a fitting hole 61 defined centrally therein. The fitting hole 61 has a diameter dimensioned to fit over the mount boss 52 of the blade mount 5. The blade grip flange 6 has, on its side facing the flange 51 of the blade mount 5, an annular grip surface 62 along an outer circumferential edge thereof for gripping the cutting blade 43, and an annular recess 63 defined therein radially inwardly of the grip surface 62 and having an ultrasonic transducer housing portion 63a for housing a second ultrasonic transducer 8b to be described later. A contact member 60 made of synthetic resin or the like is mounted on the grip surface 62. The contact member 60 should preferably have a Shore hardness D40 or higher. The blade grip flange 6 has a plurality of axially through holes 64 defined therein between the ultrasonic transducer housing portion 63a and the fitting hole 61. In the illustrated embodiment, as shown in FIG. 2, the axially through holes 64 include four arcuate holes.

For securely holding the cutting blade 43 with the blade mount 5 and the blade grip flange 6 described above, the fitting hole 521 defined in the mount boss 52 of the blade mount 5 is fitted over the tapered outer circumferential surface 421 of the distal end portion of the rotary spindle 42, as shown in FIG. 3. Then, a first fastening nut 71 is threaded over the male threads 422 on the distal end of the rotary spindle 42, thereby fastening the blade mount 5 to the rotary spindle 42. Thereafter, the fitting hole 431 defined in the cutting blade 43 is fitted over the mount boss 52 of the blade mount 5. Then, the fitting hole 61 defined in the blade grip flange 6 is fitted over the mount boss 52 of the blade mount 5. After the cutting blade 43 and the blade grip flange 6 are thus fitted over the mount boss 52 of the blade mount 5, a second fastening nut 72 is threaded over the male threads 522 on the mount boss 52 of the blade mount 5, thereby securely gripping the cutting blade 43 between the contact member 50 mounted on the annular grip surface 511 of the blade mount 5 and the contact member 60 mounted on the annular grip surface 62 of the blade grip flange 6.

As shown in FIG. 3, the spindle unit 4 as the cutting means in the illustrated embodiment includes a first ultrasonic transducer 8a housed in the ultrasonic transducer housing portion 512a disposed in the annular recess 512 defined in the flange 51 of the blade mount 5 and a second ultrasonic transducer 8b housed in the ultrasonic transducer housing portion 63a disposed in the annular recess 63 defined in the blade grip flange 6.

Figure 4:
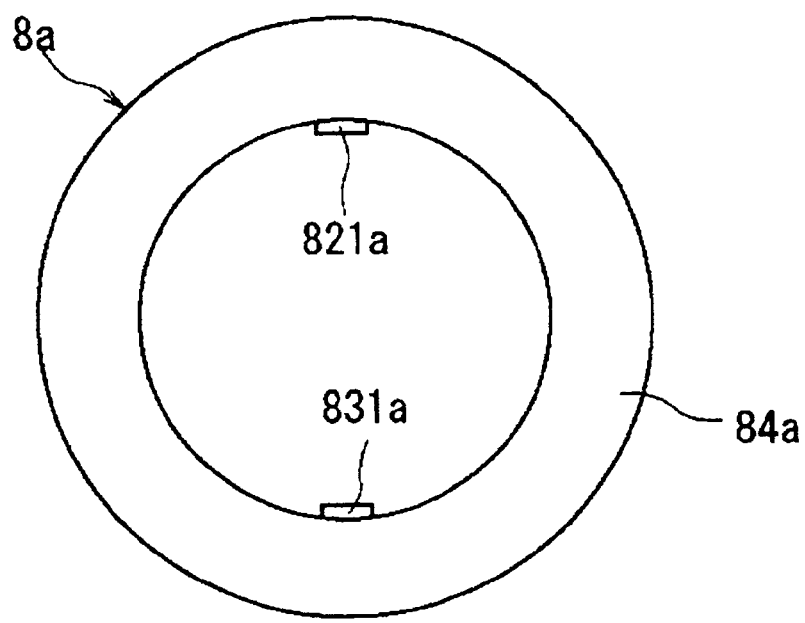
FIG. 4 is a front elevational view of a first ultrasonic transducer mounted on the spindle unit shown in FIG. 3.

The first ultrasonic transducer 8a includes an annular piezoelectric body 81a polarized in an axial direction of the rotary spindle 42, two annular electrode plates 82a, 83a mounted respectively on the opposite polarized surfaces of the piezoelectric body 81a, and an insulator 84a covering the piezoelectric body 81a and the electrode plates 82a, 83a. The piezoelectric body 81a is made of piezoelectric ceramics such as barium titanate, lead zirconate titanate and lithium tantalate. As shown in FIGS. 3 and 4, the electrode plate 82a includes an electrode terminal 821a bent over along an inner circumferential surface of the insulator 84a. The electrode plate 83a includes an electrode terminal 831a angularly spaced 180° from the electrode terminal 821a of the electrode plate 82a and bent over along an inner circumferential surface of the insulator 84a. The first ultrasonic transducer 8a thus constructed is mounted in and bonded by an appropriate adhesive to the ultrasonic transducer housing portion 512a disposed in the annular recess 512 defined in the flange 51 of the blade mount 5.

Figure 5:
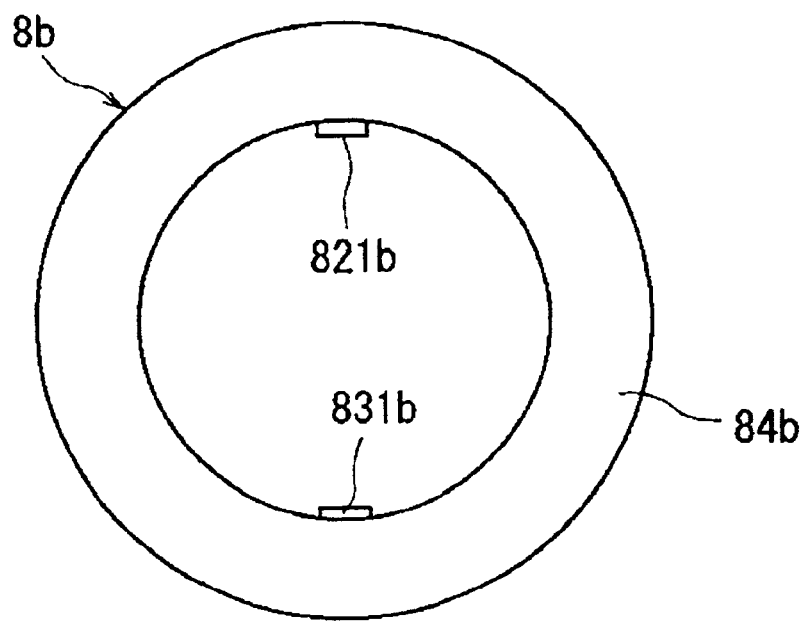
FIG. 5 is a front elevational view of a second ultrasonic transducer mounted on the spindle unit shown in FIG. 3.

The second ultrasonic transducer 8b includes an annular piezoelectric body 81b polarized in an axial direction of the rotary spindle 42, two annular electrode plates 82b, 83b mounted respectively on the opposite polarized surfaces of the piezoelectric body 81b, and an insulator 84b covering the piezoelectric body 81b and the electrode plates 82b, 83b. The piezoelectric body 81b is made of piezoelectric ceramics such as barium titanate, lead zirconate titanate and lithium tantalate. As shown in FIGS. 3 and 5, the electrode plate 82b includes an electrode terminal 821b bent over along an inner circumferential surface of the insulator 84b. The electrode plate 83b includes an electrode terminal 831b angularly spaced 180° from the electrode terminal 821b of the electrode plate 82b and bent over along an inner circumferential surface of the insulator 84b. The second ultrasonic transducer 8b thus constructed is mounted in and bonded by an appropriate adhesive to the ultrasonic transducer housing portion 63a disposed in the annular recess 63 defined in the blade grip flange 6.

As shown in FIG. 3, the spindle unit 4 as the cutting means in the illustrated embodiment also includes electrode terminals 101, 102 exposed on an outer circumferential surface of the mount boss 52 of the blade mount 5 in facing relation to the first ultrasonic transducer 8a, and electrode terminals 111, 112 exposed on an outer circumferential surface of the mount boss 52 of the blade mount 5 in facing relation to an inner circumferential surface of the blade grip flange 6. The electrode terminals 101, 102 are angularly spaced 180° from each other. The electrode terminal 101 is connected by a lead 103 to the electrode terminal 821a of the electrode plate 82a of the first ultrasonic transducer 8a. The electrode terminal 102 is connected by a lead 104 to the electrode terminal 831a of the electrode plate 83a of the first ultrasonic transducer 8a. The electrode terminals 111, 112 are angularly spaced 180° from each other. The electrode terminal 111 is held in contact with an electrode 114 disposed on the inner circumferential surface of the blade grip flange 6. The electrode 112 is held in contact with an electrode 115 disposed on the inner circumferential surface of the blade grip flange 6 and angularly spaced 180° from the electrode 114. The electrode 114 is connected by a lead 116 to the electrode terminal 821b of the electrode plate 82b of the second ultrasonic transducer 8b. The electrode 115 is connected by a lead 117 to the electrode terminal 831b of the electrode plate 83b of the second ultrasonic transducer 8b.

The spindle unit 4 as the cutting means in the illustrated embodiment further includes voltage applying means 9 for applying an AC voltage to the first ultrasonic transducer 8a and the second ultrasonic transducer 8b. The voltage applying means 9 includes power receiving means 91 disposed in the blade mount 5 and power feeding means 92 mounted on the distal end face of the spindle housing 41 in facing relation to the power receiving means 91. The power receiving means 91 includes a rotor core 911 fitted in a fitting recess 514 defined in a surface of the blade mount 5 remote from the annular recess 512, i.e., a surface of the blade mount 5 which faces the spindle housing 41, the rotor core 911 having an annular groove 911a defined therein, and a power receiving coil 912 disposed in the annular groove 911a of the rotor core 91. The power receiving coil 912 of the power receiving means 91 has an end 912a connected to the electrode terminals 101, 111 by a lead 913 disposed in the blade mount 5. The power receiving coil 912 has an opposite end 912b connected to the electrode terminals 102, 112 by a lead 914 disposed in the blade mount 5. The leads 913, 914 and the electrode terminals 101, 102, 111, 112, 114, 115 are disposed in the blade mount 5 and the blade grip flange 6 with insulators, not shown, interposed therebetween.

The power feeding means 92 includes a stator core 921 having an annular groove 921a defined in a surface thereof which faces the power receiving means 91, and a power feeding coil 922 disposed in the annular groove 921a in the stator core 921. The stator core 921 is fastened to the distal end face of the spindle housing 41 by mounting bolts 923. The power feeding coil 922 of the power feeding means 92 is connected to an AC power supply 93 by electric wires 924, 925. In the illustrated embodiment, the voltage applying means 9 has a frequency converter 94 for converting the frequency of the AC power supply 93. The power receiving means 91 and the power feeding means 92 constituted above make up a rotary transfer.

The power applying means 9 shown in FIG. 2 through 5 is constructed as described above. Operation of the power applying means 9 will be described below. An AC voltage whose frequency has been converted into a given frequency by the frequency converter 94 is applied from the AC power supply 93 to the power feeding coil 922 of the power feeding means 92. The AC voltage of the given frequency is applied through the power receiving coil 912 of the power receiving means 91 which is rotating, the lead 913, the electrode terminal 101, the lead 103, the lead 914, the electrode terminal 102, and the lead 104 between the electrode plates 82a, 83a of the first ultrasonic transducer 8a, and is also applied through the lead 913, the electrode terminal 111, the electrode terminal 114, the lead 116, the lead 914, the electrode terminal 112, the electrode terminal 115, and the lead 117 between the electrode plates 82b, 83b of the second ultrasonic transducer 8b. As a result, the first ultrasonic transducer 8a and the second ultrasonic transducer 8b are repeatedly displaced radially to vibrate ultrasonically. Therefore, the blade mount 5 and the blade grip flange 6 on which the first ultrasonic transducer 8a and the second ultrasonic transducer 8b are mounted, respectively, also vibrate ultrasonically, causing the cutting blade 43 gripped by the blade mount 5 and the blade grip flange 6 to vibrate ultrasonically.

In the illustrated embodiment, the flange 51 of the blade mount 5 has the axially through holes 513, the blade grip flange 6 has the axially through holes 64. Therefore, the blade mount 5 and the blade grip flange 6 have their rigidity reduced by these through holes, and vibrate ultrasonically with an increased amplitude. Accordingly, the cutting blade 43 gripped by the blade mount 5 and the blade grip flange 6 is caused to vibrate ultrasonically with a large radial amplitude. In the illustrated embodiment, since the contact member 50 is mounted on the annular grip surface 511 of the blade mount 5, and the contact member 60 is mounted on the annular grip surface 62 of the blade grip flange 6, any undesirable slippage of the cutting blade 43 with respect to the blade mount 5 and the blade grip flange 6 is relatively small. Consequently, the ultrasonic vibrations of the blade mount 5 and the blade grip flange 6 are effectively transmitted to the cutting blade 43.

In an experiment, the inventors fabricated a blade mount 5 having a diameter of 50 mm with four axially through holes 531 (each having a width of 0.5 mm and an arcuate length of 15 mm) and a blade grip flange 6 having a diameter of 50 mm with four axially through holes 64 (each having a width of 0.5 mm and an arcuate length of 15 mm). The inventors also fabricated a first ultrasonic transducer 8a and a second ultrasonic transducer 8b whose piezoelectric bodies 81a, 81b were made of lead zirconate titanate. The inventors operated the resultant cutting apparatus with voltage applying means 9 applying an AC voltage of 150 V at a frequency of 50 kHz, and measured the cutting blade 43 for displacement. The cutting blade 43 was displaced radially with an amplitude of 6 μm at a frequency of 50 kHz. The inventors also conducted an additional experiment on a conventional cutting apparatus with no axially through holes defined in the blade mount 5 and the blade grip flange 6. In the additional experiment, the cutting blade 43 was displaced radially with an amplitude of 0.2 μm when the same AC voltage was applied at the same frequency as described above.

The spindle unit 4 as the cutting means constituted above is displaced by indexing means, not shown, in the indexing direction indicated by the arrow Y in FIG. 1, and is also displaced by feeding means, not shown, in the cutting-in direction indicated by the arrow Z in FIG. 1.

As shown in FIG. 1, the cutting apparatus in the illustrated embodiment includes image capturing means 12 for capturing an image of the surface of the workpiece held on the chuck table 3 to detect an area of the workpiece to be cut by the cutting blade 43. The image capturing means 12 include optical means including a microscope and a CCD camera. The cutting apparatus also includes display means 13 for displaying an image captured by the image capturing means 22.

The apparatus housing 2 includes a cassette placement region 14a which accommodates therein a cassette placement table 14 for placing thereon a cassette accommodating a workpiece to be cut. The cassette placement table 14 is vertically movable by lifting and lowering means, not shown. A cassette 15 housing a workpiece W, typically a semiconductor wafer, therein is placed on the cassette placement table 14. The workpiece W to be accommodated in the cassette 15 has a grid-like pattern of streets on its upper surface which define a plurality of rectangular areas with devices such as capacitors, LEDs and circuits formed therein. The workpiece W formed above has its lower reverse surface bonded to the upper surface of a protective tape T that is mounted on an annular support frame F and is housed in the cassette 15.

The cutting apparatus in the illustrated embodiment further includes unloading means 17 for unloading the workpiece W supported on the annular support frame F by the protective tape T from the cassette 15 on the cassette placement table 14 onto a temporary table 16, first delivery means 18 for delivering the workpiece W from the temporary table 16 onto the chuck table 3, cleaning means 19 for cleaning the workpiece W which has been cut on the chuck table 3, and second delivery means 20 for delivering the workpiece W which has been cut on the chuck table 3 from the chuck table 3 to the cleaning means 19.

The operation of the cutting apparatus constituted above is described briefly below.

The workpiece W housed in a given position in the cassette 15 on the cassette placement table 14 is brought into an unloading position in the cassette 15 as the cassette placement table 14 is vertically moved by the lifting and lowering means. Then, the unloading means 17 is moved back and forth to unload the workpiece W from the unloading position onto the temporary table 16. The workpiece W placed on the temporary table 16 is delivered onto the chuck table 3 by the first delivery means 18 as it is turned. When the workpiece W is placed on the chuck table 3, suction means, not shown, is activated to attract the workpiece W to the chuck table 3. The annular support frame F on which the workpiece W is supported by the protective tape T is fixed to the chuck table 3 by the clamp 33. The chuck table 3 with the workpiece W being thus clamped thereon is moved to a position immediately below the image capturing means 12. When the chuck table 3 is positioned immediately below the image capturing means 12, the image capturing means 12 detects a desired one of the streets on the workpiece W. Based on the image information of the street detected by the image capturing means 12, the spindle unit 4 is displaced in the indexing direction indicated by the arrow Y to hold the cutting blade 43 in accurate positional alignment with the detected street.

Thereafter, the cutting blade 43 is fed a predetermined distance in the cutting-in direction indicated by the arrow Z. While the cutting blade 43 is rotating, the chuck table 3 with the workpiece W held thereon is moved at a predetermined cutting speed in the feeding direction indicated by the arrow X toward the cutting blade 43, which is perpendicular to the rotational axis of the cutting blade 43, causing the cutting blade 43 to cut the workpiece W along the street. During the cutting process, the voltage applying means 9 is energized to cause the first ultrasonic transducer 8a and the second ultrasonic transducer 8b to vibrate ultrasonically in their radial direction. As a result, since the blade mount 5 and the blade grip flange 6 cause the cutting blade 43 to vibrate ultrasonically with a large amplitude in the radial direction, the resistance to the cutting movement of the cutting blade 43 is reduced, allowing the cutting blade 43 to cut the workpiece W easily even if its substrate is made of a material hard to cut, such as sapphire.

After the workpiece W is cut along the street, the chuck table 3 is indexed over an interval between adjacent streets in the indexing direction indicated by the arrow Y. Then, the above cutting process is repeated. After the workpiece W is cut along all the streets in one direction, then the chuck table 3 is turned 90° and the workpiece W is cut successively along streets perpendicularly to the streets along which the workpiece W has been cut. When the workpiece W is cut along all the streets thereon, it is divided into individual chips. Because the chips stick to the protective tape T, they are not separated but remain to be supported together on the frame F.

When the entire cutting process is finished, the chuck table 3 with the cut workpiece W held thereon is returned to the position where it initially attracted the workpiece W. Then, the chuck table 3 releases the cut workpiece W, which is delivered to the cleaning means 19 by the second delivery means 20. The second delivery means 20 then cleans and dries the cut workpiece W. The cleaned and dried workpiece W is then placed onto the temporary table 14 by the first delivery means 18. The workpiece W is then stored back into a given position in the cassette 15 by the unloading means 17. Therefore, the unloading means 17 also functions as loading means for loading the cut workpiece W into the cassette 15.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus comprising:
a chuck table for holding a workpiece; and
cutting means having a cutting blade for cutting the workpiece held by said chuck table, said cutting means including a spindle rotatably supported by a spindle housing, a blade mount mounted on an end portion of said spindle and having a first ultrasonic transducer for imparting ultrasonic vibrations to said cutting blade, and a blade grip flange disposed on said blade mount for gripping said cutting blade in coaction with said blade mount and having a second ultrasonic transducer for imparting ultrasonic vibrations to said cutting blade;
said blade mount including:
an annular flange having a grip surface on an outer circumferential side surface for gripping said cutting blade and a first ultrasonic transducer housing portion for housing said first ultrasonic transducer; and
a hollow cylindrical mount boss laterally projecting centrally from said annular flange and having a fitting hole fitting over said spindle;
said annular flange having a plurality of through holes defined between said first ultrasonic transducer housing portion and said mount boss;
said blade grip flange having a fitting hole defined centrally and fitted over said mount boss, a grip surface on an outer circumferential side surface for gripping said cutting blade, a second ultrasonic transducer housing portion for housing said second ultrasonic transducer, and a plurality of through holes defined between said second ultrasonic transducer housing portion and said fitting hole.

2. The cutting apparatus according to claim 1, further comprising contact members mounted respectively on the grip surface of said blade mount and the grip surface of said blade grip flange.

* * * * *